United States Patent
Strom et al.

(10) Patent No.: US 8,089,292 B2
(45) Date of Patent: *Jan. 3, 2012

(54) SYSTEM AND METHOD OF MEASURING PROBE FLOAT

(75) Inventors: John T. Strom, North Bend, WA (US); Raymond H. Kraft, Seattle, WA (US)

(73) Assignee: Rudolph Technologies, Inc., Bloomington, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/637,858

(22) Filed: Dec. 15, 2009

(65) Prior Publication Data

US 2010/0321056 A1    Dec. 23, 2010

Related U.S. Application Data

(63) Continuation of application No. 10/801,944, filed on Mar. 15, 2004, now Pat. No. 7,633,306.

(60) Provisional application No. 60/454,572, filed on Mar. 14, 2003.

(51) Int. Cl.
*G01R 31/02*    (2006.01)

(52) U.S. Cl. .............................. 324/750.19; 324/750.24
(58) Field of Classification Search .................. None
See application file for complete search history.

(56) References Cited

U.S. PATENT DOCUMENTS

| | | | |
|---|---|---|---|
| 5,861,759 | A | 1/1999 | Bialobrodski et al. |
| 6,118,894 | A | 9/2000 | Schwartz et al. |
| 6,420,892 | B1 | 7/2002 | Krivy et al. |

FOREIGN PATENT DOCUMENTS

| | | |
|---|---|---|
| GB | 2 014 315 A | 8/1979 |
| GB | 2 368 912 A | 5/2002 |
| JP | 5-166892 A | 7/1993 |
| WO | 2004/083873 A2 | 9/2004 |

*Primary Examiner* — Paresh Patel
(74) *Attorney, Agent, or Firm* — Dicke, Billig & Czaja PLLC

(57) ABSTRACT

A system and method allow accurate calculation of probe float through optical free-hanging and electrical planarity measurement techniques. In accordance with an examplary embodiment, probe float may be determined by acquiring a free-hanging planarity measurement, obtaining a first electrical contact planarity measurement, and calculating probe float using results of the acquiring and the obtaining operations.

20 Claims, 3 Drawing Sheets

SYSTEM AND METHOD OF MEASURING PROBE FLOAT

CROSS-REFERENCE TO RELATED APPLICATIONS

The present application is a continuation of U.S. patent application Ser. No. 10/801,944, now U.S. Pat. No. 7,633,306 entitled "SYSTEM AND METHO OF MEASURING PROBE FLOAT", filed Mar. 15, 2004, which claims the benefit of U.S. Provisional Application Ser. No. 60/454,572, filed Mar. 14, 2003, entitled "A METHOD FOR MEASURING PROBE FLOAT FOR PROBE CARD TECHNOLOGIES ALLOWING FREE, LIMITED VERTICAL MOTION", the contents of each aforementioned application are hereby incorporated herein by reference in their entirety.

FIELD OF THE INVENTION

Aspects of the present invention relate generally to the field of probe card analysis, and more particularly to a system and method providing accurate calculation of probe float through optical free-hanging and electrical planarity measurement techniques.

BACKGROUND OF THE INVENTION

Traditional probe card analyzers measure probe planarity by electrical means, and generally measure probe alignment by optical means. Electrical planarity measurements are typically made by slowly bringing a conductive contact surface into contact with the probes on a probe card. In that regard, the conductive contact surface is moved toward the probe card; the conductive surface first makes contact with the probe that extends furthest from the probe card surface (the "lowest" probe), and finally makes contact with the probe that extends least from the probe card surface (the "highest" probe). The process of moving the conductive contact surface from first to last contact point and beyond is generally referred to in the art as "overtravel", since the first probe to make contact with the conductive contact surface is loaded beyond the point of first contact.

Some conventional probe card technologies implement probes having limited free vertical travel; in the "free-hanging" state, probes are not electrically connected to the probe card. Using traditional electrical planarity measurement technology, it is possible to overtravel the probes into a conductive contact surface and measure the overtravel associated with first electrical continuity. Currently implemented systems and methods are deficient, however, in that traditional methodologies do not enable accurate measurement of the range of free, electrically insulated, vertical motion, also known as "float".

SUMMARY OF THE INVENTION

Aspects of the present invention overcome the foregoing and other shortcomings of conventional technology, providing a system and method allowing accurate calculation of probe float through optical free-hanging and electrical planarity measurement techniques.

In accordance with one embodiment, for example, a method of calculating probe float comprises: acquiring a free-hanging planarity measurement; obtaining a first electrical contact planarity measurement; and calculating probe float using results of the acquiring and the obtaining.

The foregoing and other aspects of the disclosed embodiments will be more fully understood through examination of the following detailed description thereof in conjunction with the drawing figures.

DETAILED DESCRIPTION OF THE INVENTION

As set forth in more detail below, exemplary systems and methods may embody hybrid measurement techniques capable of measuring probe float and free-hanging, first touch planarity. By way of example, such a hybrid technique may employ a combination of electrical measurements and optical measurements.

By way of general background, it will be appreciated that one approach to obtaining optical planarity measurements generally known in the art may employ three-dimensional comparative metrology using a substantially transparent fiducial substrate, e.g., a glass, acrylic, quartz, or other suitably transparent fiducial plate as set forth in more detail below. Other optical planarity assessment methods may be known or developed in accordance with generally known principles.

Figure 1:
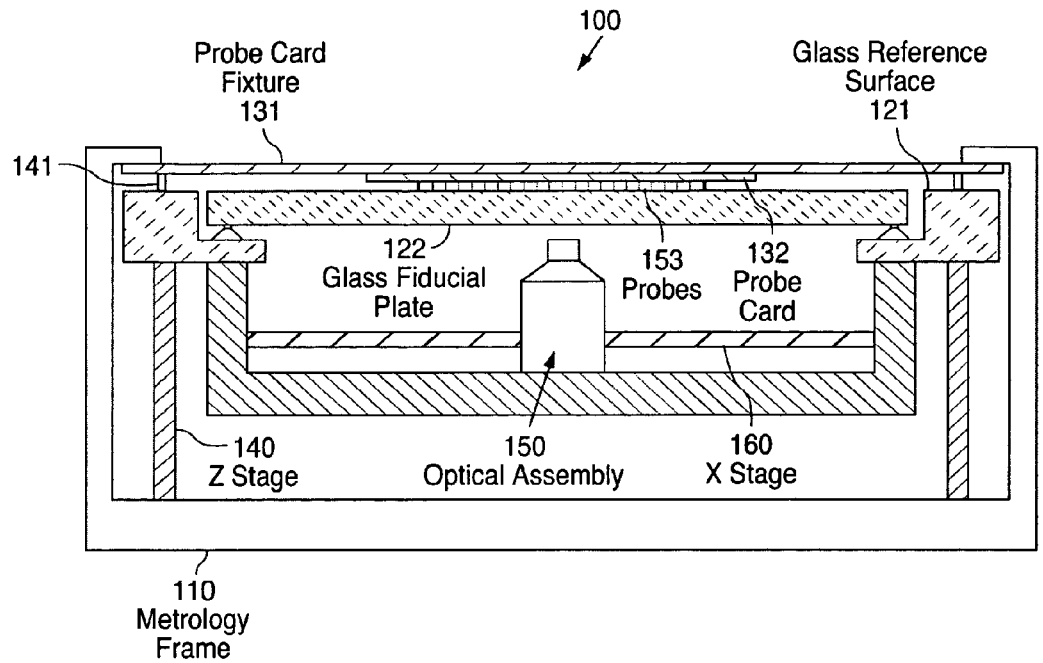
FIG. 1 is a simplified block diagram illustrating components of one embodiment of a probe card analyzer system.

Turning now to the drawing figures, FIG. 1 is a simplified block diagram illustrating components of one embodiment of a probe card analyzer system. As is generally known in the art, system 100 may comprise a metrology frame 110 to which other components are mounted. Specifically, exemplary system 100 generally comprises a plate reference surface 121 configured and operative to carry or otherwise to support a substantially transparent fiducial plate 122, a probe card 132 attached to or otherwise supported by a probe card fixture 131, and a z-stage 140 configured and operative to provide relative movement (along an axis, z, e.g., vertically in FIG. 1) between fiducial plate 122 and probe card 132. In some embodiments, one or more sensors, such as z-sensor 141, for example, may measure the relative distance between probe card fixture 131 and plate reference surface 121.

Typically, fiducial plate 122, in addition to being substantially transparent as set forth in more detail below, is also electrically conductive to enable electrical planarity measurements.

Optics assembly 150 may be employed to acquire image data (e.g., visual or optical data) of one or more probes 133 through substantially transparent fiducial plate 122. Accordingly, the term "substantially transparent" in this context generally refers to the quality of allowing transmission of sufficient energy in at least a portion of the electromagnetic spectrum, such as the visible wavelengths of the spectrum, for example, to allow optics assembly 150 to acquire such images or optical data through fiducial plate 122. It will be appreciated that various factors may affect characterization of a particular fiducial plate 122 as "substantially transparent" in this context. For example, "substantial" transparency may be affected or influenced by some or all of the following, among other factors: transmission properties and attenuation properties (such as the refractive index, the presence and density of any occlusions, etc.) of the material used to construct fiducial plate 122; the thickness of fiducial plate 122 along the optical axis of optics assembly 150; the type (frequency and amplitude, for example) of energy impinging upon or passing through fiducial plate 122; the capabilities and sensitivity of optics or imaging hardware employed at optics assembly 150; and the like. In some embodiments, fiducial plate 122 may be constructed of glass, acrylic, quartz, or a similar material substantially transparent to electromagnetic energy in a predetermined or desired portion of the spectrum.

It will be appreciated that system 100 may also comprise various motors, actuators, positional sensors, and the like (not shown in FIG. 1) configured and generally operative to control relative positioning and orientation of the various components such as z-stage 140, x-stage 160, y-stage (not shown), optics assembly 150, fiducial plate 122, and probe card 132. For example, the operational focal length or depth of field (DOF) of optical equipment, lens arrangements, sensors (such as a charge-coupled device (CCD) or complementary metal-oxide semiconductor (CMOS) detector), or other imaging hardware utilized at optics assembly 150 may affect the optimum or desired distance (in the z dimension) between optics assembly 150 and fiducial plate 122. Similarly, selective positioning of optics assembly 150 relative to fiducial plate 122, probe card 132, or both, in either or both of the x and y directions may be required or desired. In many applications, precise three-dimensional positioning and orientation of the various components may be influenced or controlled by one or more computers, micro-controllers, programmable logic controllers, or other electronic or electromechanical components such as stepper motors, worm gears, precision actuators, and the like. Numerous hardware and software configurations suitable for this purpose are generally known in the art, and are susceptible of many variations and modifications. The present disclosure is not intended to be limited by any particular combination of hardware elements and software modules operative selectively to manipulate the components of system 100 in three-dimensional space.

Additionally, various components illustrated in the exemplary FIG. 1 embodiment may be coupled to one or more computers or other processing components. Specifically, a data processing component comprising hardware and software may be configured and operative to receive acquired image data and to compute planarity, for example, or to perform other operations. Such a data processing component may additionally be operative to command or request movement or rotation of various system components to compensate for system component deflections, for example. The present disclosure is not intended to be limited by any particular data processing hardware or software implementation, control electronics, feedback mechanisms, and the like.

Figure 2:
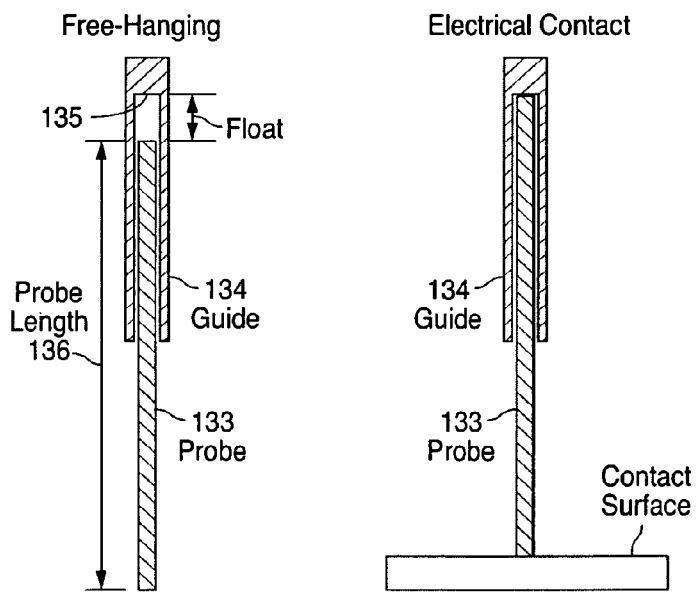
FIG. 2 is a simplified block diagram illustrating a vertical probe with float and depicting both the free-hanging state and the first electrical contact state.

FIG. 2 is a simplified block diagram illustrating a vertical probe with float and depicting both the free-hanging state and the first electrical contact state. In the "free-hanging" state, probe 133 is generally not electrically connected to probe card 131 (not shown in FIG. 2). As indicated on the left side of FIG. 2, probe 133 may be allowed a range of free, electrically insulated, vertical motion in a guide 134. Electrical contact with probe card 131 (such as at a surface 135) may be made through relative positioning of probe 133 and the contact surface as indicated on the right side of FIG. 2. In that regard, first electrical contact may generally occur when the contact surface and surface 135 at the end of guide 134 are relatively positioned at a distance equal to the probe length 136; as set forth above, probe 133 may be overtraveled beyond the point of first electrical contact in many applications. The range of travel through which probe 133 may be translated linearly in guide 134 prior to contact with surface 135 is referred to as "float."

As probes 133 are electrically insulated in the free-hanging state, probe card planarity in this instance may be measured by means other than electrical. In an exemplary embodiment, free-hanging planarity may be measured optically. In that regard, the location of probes 133 (and more generally, the approximate probe plane) may be estimated prior to imaging.

Figure 3:
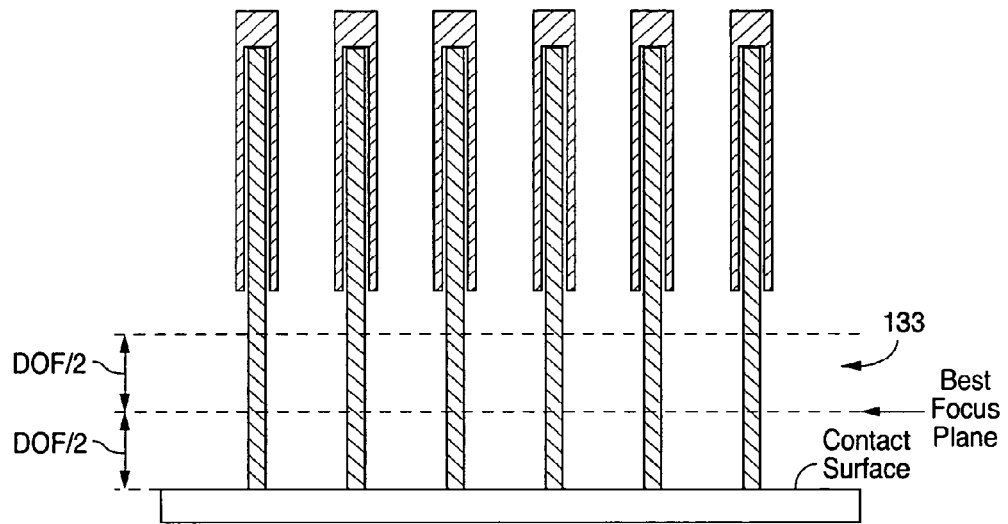
FIG. 3 is a simplified block diagram illustrating an array of vertical probes with float and depicting an overtraveled state of last electrical contact.

In that regard, the probe plane may be located in one exemplary embodiment by overtraveling probe card 131 to the position of last electrical contact. FIG. 3 is a simplified block diagram illustrating an array of vertical probes with float and depicting an overtraveled state of last electrical contact. Specifically, this state of last electrical contact represents relative positioning between the contact surface and probe card 131 (not shown in FIG. 3) when the "highest" probe 133 (i.e., probe 133 that extends least from probe card 131) makes electrical contact. At this position, the contact surface may be at the lowest possible position (e.g., in the z-direction, measured relative to probe card 131) consistent with every probe 133 making electrical contact.

At the state of last electrical contact depicted in FIG. 3, a reference planarity of all probes 133 may be measured, for example, by performing an optical scan or otherwise acquiring optical reference planarity data. This reference planarity is ideally zero, but may be small and non-zero due to various factors such as stereoscopic perspective effects, for example, or other optical or imaging limitations associated with components of the imaging system employed to acquire the data.

The contact surface may then be lowered relative to probe card 131 by a fraction of the depth of field (DOF) associated with the imaging system; additionally or alternatively, probe card 131 may be raised relative to the contact surface. In one exemplary embodiment, this relative translation may be approximately DOF/2; such a relative translation may ensure that probes 133 previously making contact are still in focus. More aggressive relative translations, for example, between approximately 0.8 DOF and approximately 0.9 DOF may have utility in certain applications.

Another optical scan of all probes 133 may be performed at this new distance between the contact surface and probe card 131. If a planarity measurement for a particular probe 133 has increased by more than a minimum (e.g., predetermined or preselected) threshold value, for example, that particular probe 133 may be considered free-hanging at this iteration. For probes 133 determined to be free-hanging, the current measured planarity value may be assigned.

The process of providing relative translation between the contact surface and probe card 131, identifying new free-hanging probes 133, and assigning planarity values to newly identified free-hanging probes 133, may be selectively repeated, for example, until a free-hanging planarity value has been assigned to every probe 133. Additionally or alternatively, the forgoing iterative process may be constrained to a predetermined or preselected maximum number of iterations in some embodiments.

Figure 4:
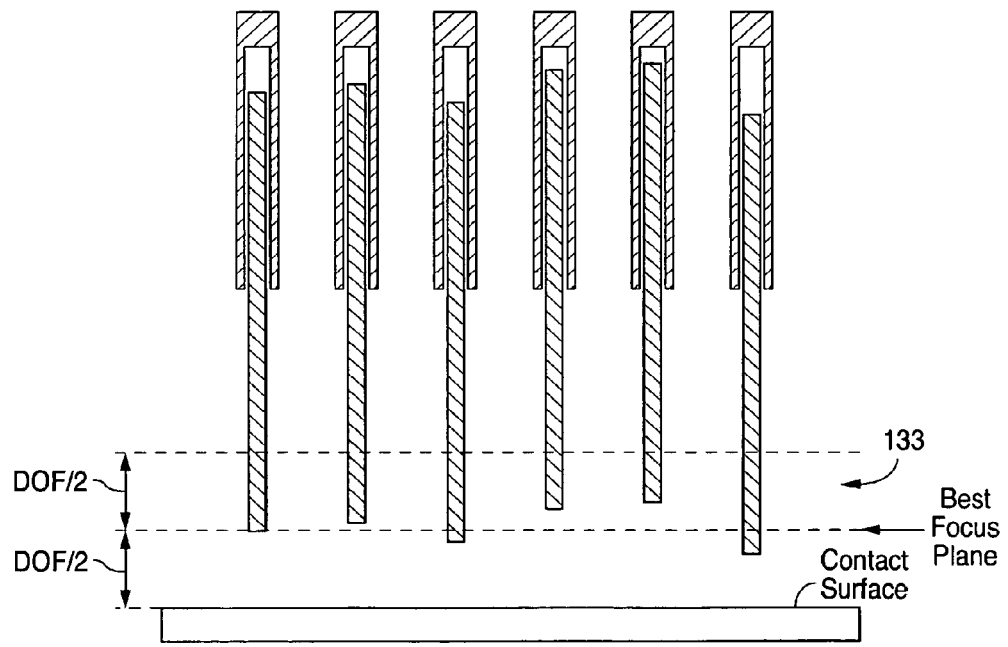
FIG. 4 is a simplified block diagram illustrating an array of vertical probes with float and depicting a free-hanging state.

FIG. 4 is a simplified block diagram illustrating an array of vertical probes with float and depicting a free-hanging state. The exemplary state illustrated in FIG. 4 represents the foregoing iterative process having been allowed to proceed until a free-hanging planarity value has been assigned to every probe 133. It will be appreciated that the number of iterations required to assign a free-hanging planarity value to every probe 133 in the array may be a function of the imaging system DOF, the nominal float distance, and the range of free-hanging planarity variation, among other factors. For typical vertical float technology employing float distances on the order of 25 microns, and where the planarity range is approximately 50 microns, a total relative translation of approximately 75 microns may be suitable.

For an accurate probe float determination or calculation, the location of first electrical contact for each probe 133 may also be measured; such measurements may comprise common electrical planarity analysis methodologies as set forth above. In that regard, electrical planarity may be measured by standard techniques in which the distance between the contact surface and probe card 131 is controlled and non-bussed probe planarity is measured directly. If float measurements are desired for bussed probes, it may also be necessary to measure bussed probe electrical planarity using a small isolated contact surface. These electrical planarity techniques are generally known in the art. In some embodiments, for example, such electrical planarity measurements may be obtained during the process of overtraveling the probe card for acquiring the reference planarity measurements described above with specific reference to FIG. 3.

Given both optical free-hanging planarity measurements and electrical planarity measurements, probe float may be calculated in a straightforward manner. For instance, the probe float for a given probe, i, may be expressed as $$f_i = p_{ei} - p_{oi}$$

where $p_{ei}$, $p_{oi}$, and $f_i$ represent the electrical planarity, the optical planarity, and the float, respectively, of probe i.

Those of skill in the art will appreciate that the probe float calculation set forth above may also include effects of probe card and probe card fixture deflection under loads that are present during overtravel between first and last electrical contact. In some embodiments, an additional measurement of card and fixture deflection may influence values for $p_{ei}$ and $p_{oi}$, effectively eliminating or minimizing deflection contributions to the float computation.

Figure 5:
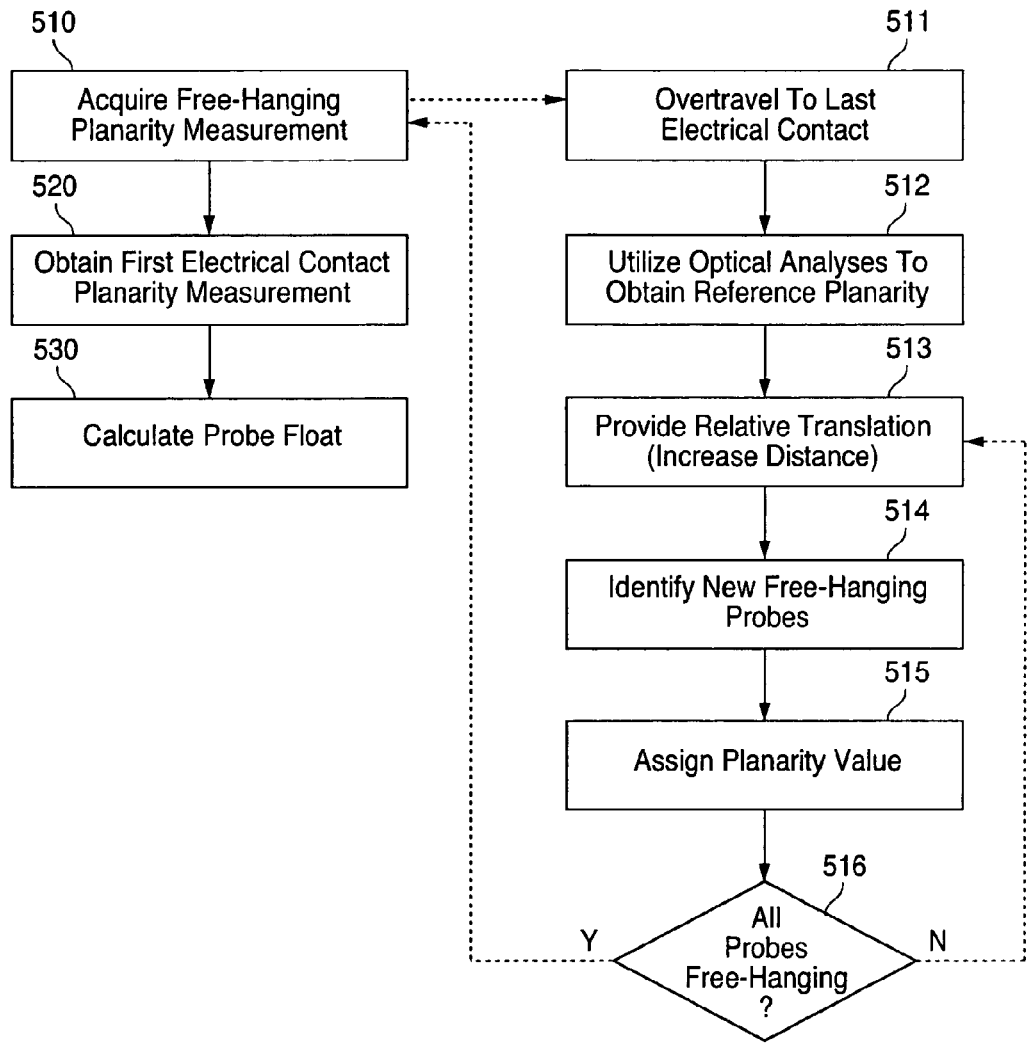
FIG. 5 is a simplified flow diagram illustrating the general operation of one embodiment of a method of calculating probe float.

FIG. 5 is a simplified flow diagram illustrating the general operation of one embodiment of a method of calculating probe float. As indicated in FIG. 5, one probe float calculation method may generally comprise acquiring a free-hanging planarity measurement (block 510), obtaining a first electrical contact planarity measurement (520), and calculating probe float (block 530) using the results of the acquiring and obtaining operations.

As set forth above with specific reference to FIGS. 3 and 4, acquisition of free-hanging planarity measurements may embody some or all of the operations illustrated at the right side of FIG. 5. Specifically, the probe card may be overtraveled to the point of last electrical contact (block 511) enabling an imaging operation to obtain reference planarity data as indicated at block 512. Relative translation of the probe card and the contact surface (block 513) may result in new free-hanging probes, which may be identified (block 514), for example, through additional imaging operations or optical data acquisition techniques. A planarity value representative of the distance between the probe card and the contact surface may be assigned to each newly identified free-hanging probe as indicated at block 515. As indicated by the loop back to block 513 from decision block 516, the foregoing providing, identifying, and assigning operations may continue in an iterative fashion until, for example, every probe in the probe card array is free-hanging and has accordingly been assigned a planarity value. Alternatively, the iterative loop may be artificially limited to a maximum number of iterations in some applications, for example.

The arrangement of the blocks depicted in FIG. 5 is not intended to imply a specific order or sequence of operations to the exclusion of other possibilities. For example, the obtaining at block 520 may precede the acquiring at block 510. Alternatively, the obtaining operation depicted at block 520, in whole or in part, may occur substantially simultaneously, or otherwise in conjunction, with the overtraveling operation at block 511, for example.

Aspects of the present invention have been illustrated and described in detail with reference to particular embodiments by way of example only, and not by way of limitation. It will be appreciated that various modifications and alterations may be made to the exemplary embodiments without departing from the scope and contemplation of the present disclosure. It is intended, therefore, that the invention be considered as limited only by the scope of the appended claims Although the present invention has been described with reference to preferred embodiments, workers skilled in the art will recognize that changes can be made in form and detail without departing from the spirit and scope of the present invention.

What is claimed is:

1. A method of calculating probe float; said method comprising:
  acquiring a free-hanging planarity measurement of probes coupled to a probe card, wherein the probes are electrically insulated from the probe card;
  obtaining a first electrical contact planarity measurement of the probes, wherein the probes are electrically connected to the probe card; and
  calculating probe float for the probes by subtracting the free-hanging planarity measurement from the first electrical contact planarity measurement.

2. The method of claim 1 wherein said calculating comprises computing a difference between results of said obtaining and said acquiring.

3. The method of claim 1 wherein said acquiring comprises:
  acquiring a reference planarity measurement;
  providing relative translation between a contact surface and a probe card;
  identifying new free-hanging probes responsive to said providing;
  assigning a planarity value to newly identified free-hanging probes; and
  selectively repeating said providing, said identifying, and said assigning.

4. The method of claim 3 wherein said selectively repeating further comprises selectively iterating said providing, said identifying, and said assigning until a free-hanging planarity value has been assigned to every probe.

5. The method of claim 3 wherein said acquiring a reference planarity measurement comprises overtraveling said probe card to a state of last electrical contact.

6. The method of claim 3 wherein said acquiring a reference planarity measurement comprises utilizing an optical system.

7. The method of claim 6 wherein said identifying new free-hanging probes comprises utilizing said optical system.

8. The method of claim 6 wherein said providing relative translation comprises increasing a distance between said contact surface and said probe card of approximately half a depth of field associated with said optical system.

9. A method of measuring probe float in a probe card analyzer system; said method comprising:

acquiring a free-hanging planarity measurement for a probe in an array on a probe card, wherein the probe is electrically insulated from the probe card;

obtaining a first electrical contact planarity measurement for said probe, wherein the probe is electrically connected to the probe card; and calculating probe float by subtracting the free-hanging planarity measurement from the first electrical contact measurement.

10. The method of claim 9 wherein said calculating comprises computing a difference between results of said obtaining and said acquiring.

11. The method of claim 9 further comprising repeating said acquiring, said obtaining, and said calculating for every probe in said array.

12. The method of claim 11 wherein said acquiring comprises:

acquiring a reference planarity measurement;

providing relative translation between a contact surface and said probe card;

identifying new free-hanging probes responsive to said providing;

assigning a planarity value to newly identified free-hanging probes; and selectively repeating said providing, said identifying, and said assigning.

13. The method of claim 12 wherein said selectively repeating further comprises selectively iterating said providing, said identifying, and said assigning until a free-hanging planarity value has been assigned to every probe in said array.

14. The method of claim 12 wherein said acquiring a reference planarity measurement comprises overtraveling said probe card to a state of last electrical contact.

15. The method of claim 12 wherein said acquiring a reference planarity measurement comprises utilizing an optical system.

16. The method of claim 15 wherein said identifying new free-hanging probes comprises utilizing said optical system.

17. The method of claim 15 wherein said providing relative translation comprises increasing a distance between said contact surface and said probe card of approximately half a depth of field associated with said optical system.

18. A computer readable medium encoded with data and instructions for calculating probe float in a probe card analyzer; said data and said instructions causing an apparatus executing said instructions to:

acquire a free-hanging planarity measurement for probes coupled to a probe card, wherein the probes are electrically insulated from the probe card;

obtain a first electrical contact planarity measurement for the probes, wherein the probes are electrically connected to the probe card; and calculate probe float by subtracting said free-hanging planarity measurement from said first electrical contact planarity measurement.

19. The computer readable medium of claim 18 further encoded with data and instructions; said data and said instructions further causing an apparatus executing said instructions to compute a difference between said free-hanging planarity measurement and said first electrical contact planarity measurement.

20. The computer readable medium of claim 18 further encoded with data and instructions; said data and said instructions further causing an apparatus executing said instructions to calculate probe float for every probe in an array.

* * * * *

UNITED STATES PATENT AND TRADEMARK OFFICE
CERTIFICATE OF CORRECTION

PATENT NO. : 8,089,292 B2  
APPLICATION NO. : 12/637858  
DATED : January 3, 2012  
INVENTOR(S) : John T. Strom et al.

It is certified that error appears in the above-identified patent and that said Letters Patent is hereby corrected as shown below:

ON THE TITLE PAGE:

Item (57) (Abstract), line 3, delete "examplary" and insert in place thereof --exemplary--.

IN THE SPECIFICATIONS:

Column 1, line 9 (Approx.), delete "METHO" and insert in place thereof --METHOD--.

Column 5, line 28, delete "probe, i," and insert in place thereof --probe i,--.

Column 6, line 18, after "claims" insert --.--.

Signed and Sealed this  
Eighth Day of May, 2012

David J. Kappos  
*Director of the United States Patent and Trademark Office*